(12) United States Patent
Maeda

(10) Patent No.: US 6,853,132 B2
(45) Date of Patent: Feb. 8, 2005

(54) EL ELEMENT, EL DISPLAY, AND ELECTRONIC APPARATUS

(75) Inventor: Tsuyoshi Maeda, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 10/076,320

(22) Filed: Feb. 19, 2002

(65) Prior Publication Data
US 2002/0135297 A1 Sep. 26, 2002

(30) Foreign Application Priority Data
Mar. 23, 2001 (JP) ........................................ 2001-085752

(51) Int. Cl.⁷ .......................... H05B 33/00; H05B 33/28
(52) U.S. Cl. .......................... 313/504; 313/509; 313/503
(58) Field of Search ................................ 313/502, 503, 313/504

(56) References Cited

U.S. PATENT DOCUMENTS

| 5,554,911 A | * | 9/1996 | Nakayama et al. | .......... 313/504 |
| 6,515,314 B1 | * | 2/2003 | Duggal et al. | .............. 313/503 |

FOREIGN PATENT DOCUMENTS

| JP | A 6-675381 | 9/1994 |
| JP | A-7-240277 | 9/1995 |
| JP | A 8-227276 | 9/1996 |
| JP | A 10-125472 | 5/1998 |
| JP | A 2000-239318 | 9/2000 |
| JP | A 2000-327598 | 11/2000 |
| JP | A 2001-35660 | 2/2001 |
| JP | A 2001-68272 | 3/2001 |
| JP | A 2001-76881 | 3/2001 |

* cited by examiner

*Primary Examiner*—Nimeshkumar D. Patel
*Assistant Examiner*—Mariceli Santiago
(74) *Attorney, Agent, or Firm*—Oliff & Berridge, PLC

(57) ABSTRACT

The invention provides an EL element, EL display, and electronic apparatus that is capable of efficiently emitting light from a light-emitting layer toward the exterior and of realizing a bright display. An EL element is provided with at least one organic layer including a light-emitting layer and a pair of electrodes opposed to each other with the aforementioned organic layer therebetween. One electrode of the aforementioned pair of electrodes is a transparent electrode, through which light emitted from the aforementioned light-emitting layer passes. A wavelength at the peak of the light emission of the aforementioned light-emitting layer and a wavelength at the peak of transmittance of the aforementioned transparent electrode are in close agreement with each other.

20 Claims, 4 Drawing Sheets

[FIG. 1]
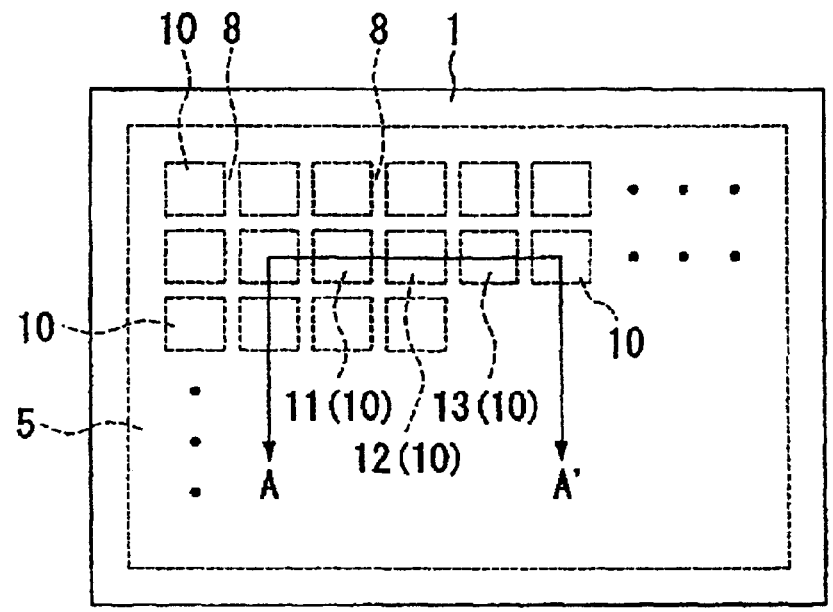
[FIG. 2]
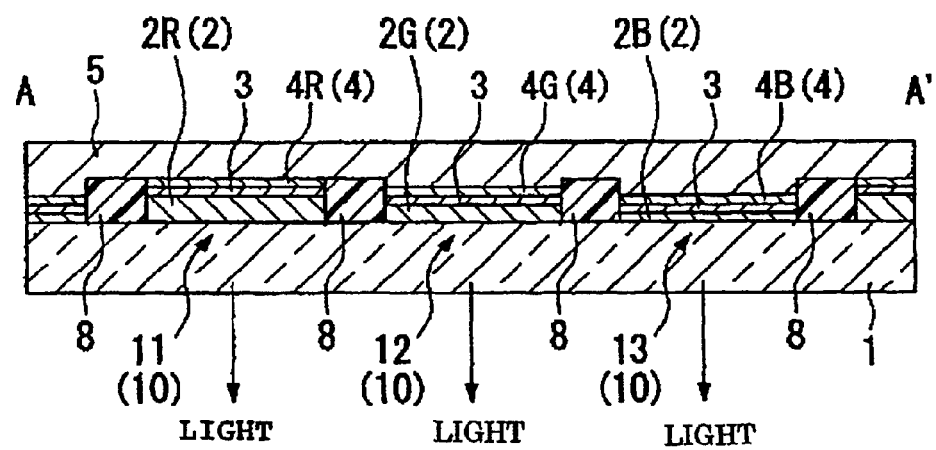

[FIG. 3]
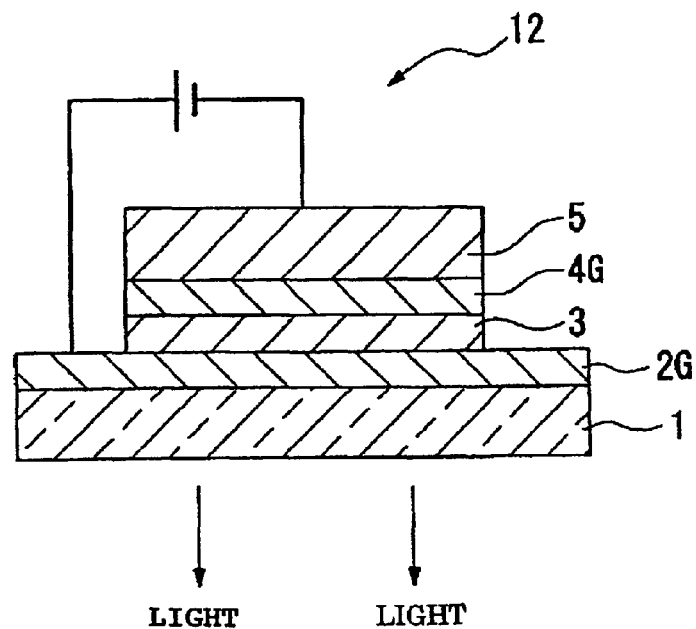
[FIG. 4]
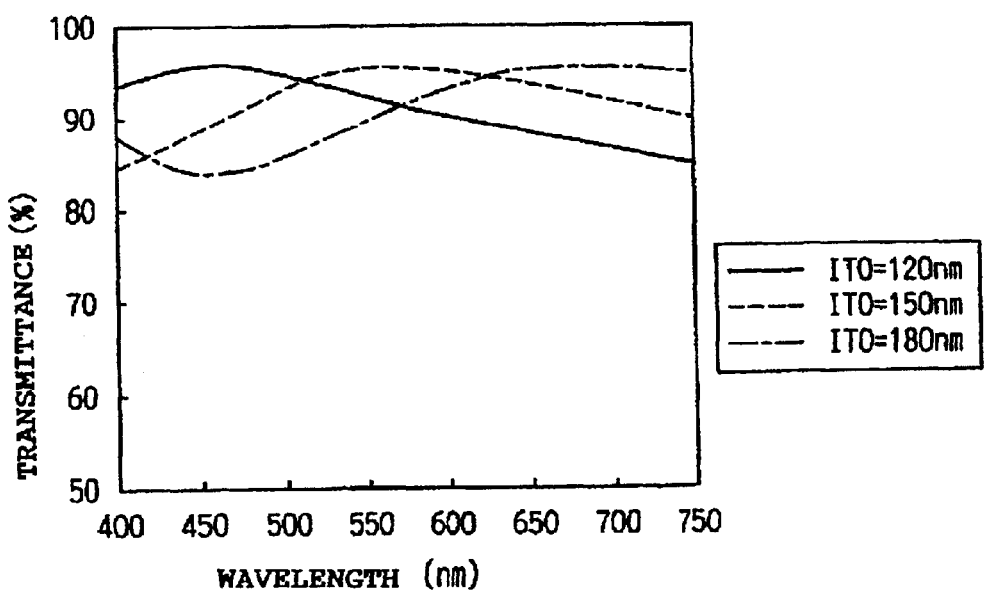

[FIG. 5]
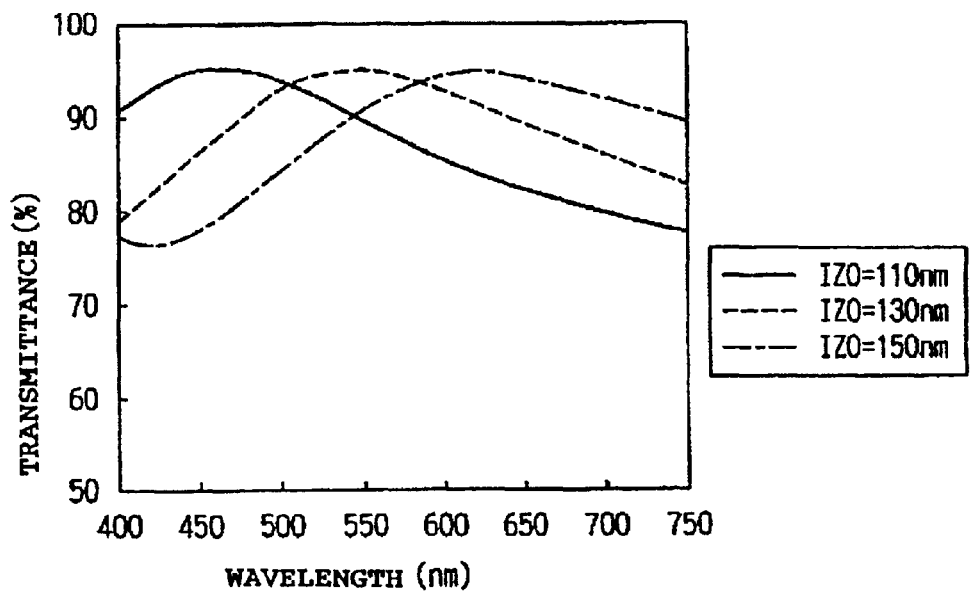
[FIG. 6]
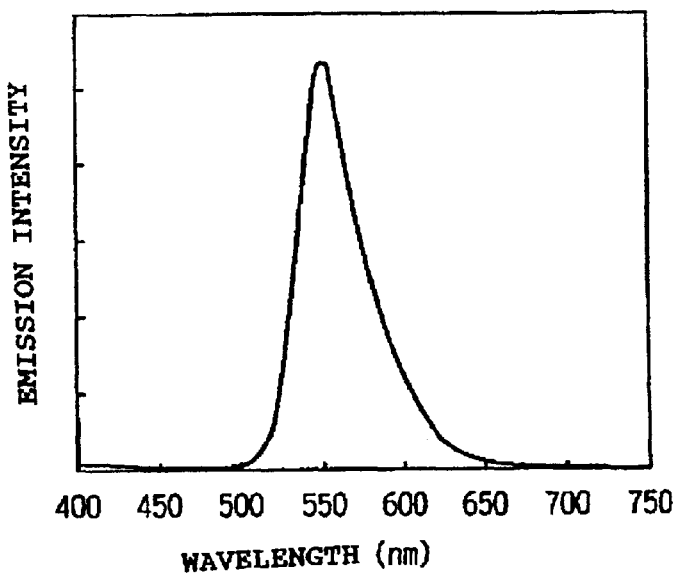

[FIG. 7]
(a)
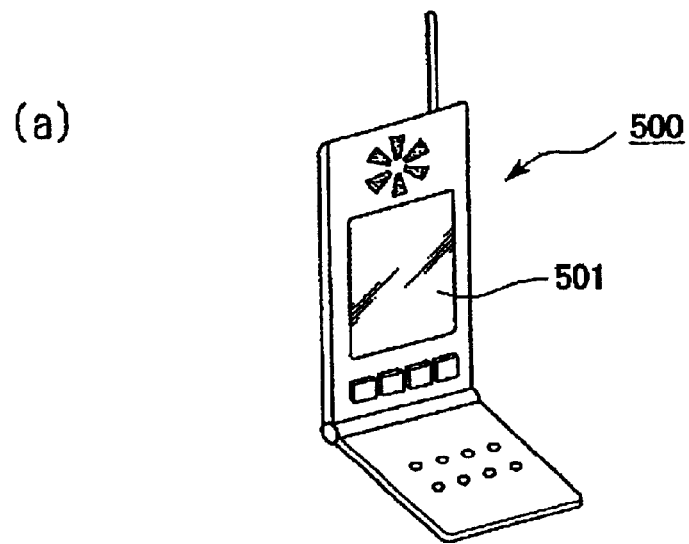
(b)
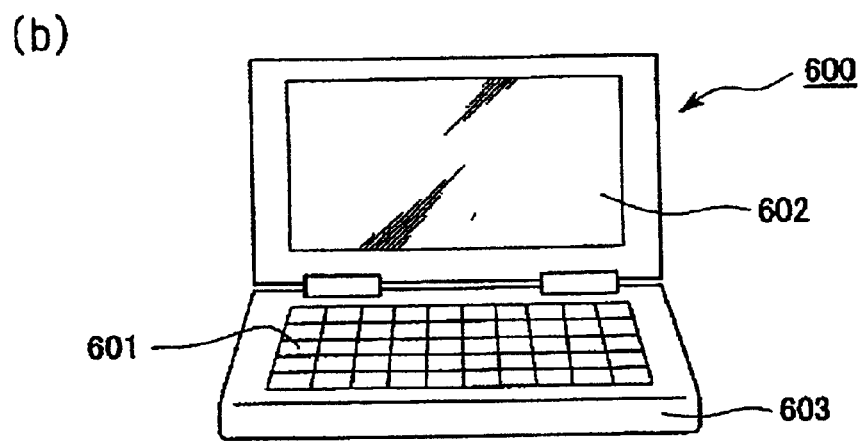
(c)
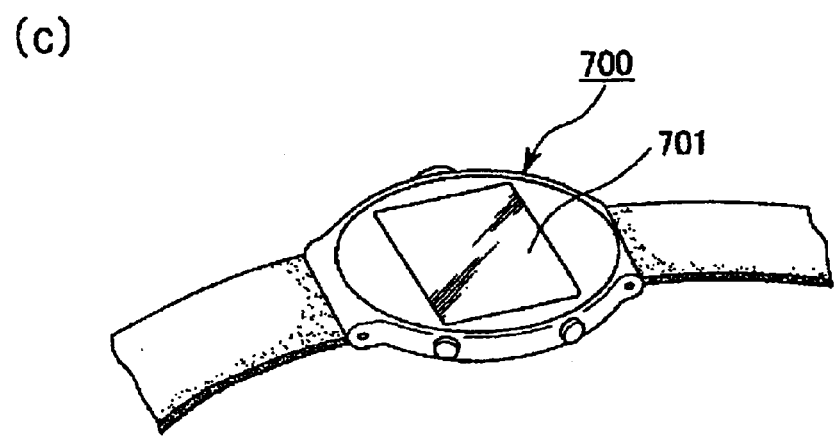

EL ELEMENT, EL DISPLAY, AND ELECTRONIC APPARATUS

BACKGROUND OF THE INVENTION

1. Field of Invention

The present invention relates to an EL element (electroluminescent element), EL display, and electronic apparatus. In particular, the invention relates to an EL element capable of realizing well-lighted display having a high emission efficiency, as well as to an EL display and an electronic apparatus provided with the aforementioned EL element.

2. Description of Related Art

Related art EL displays have been provided with EL elements. Examples of the EL elements include, for example, one in which a transparent electrode made of Indium Tin Oxide (hereafter abbreviated as "ITO"), or other material, and functioning as an anode, at least one organic layer including a light-emitting layer, and a metal electrode functioning as a cathode, are laminated in that order on a transparent substrate that is made of glass or other material. The transparent electrode and the metal electrode are arranged to be opposed to each other with the organic layer therebetween. In such an EL element, by the passage of a predetermined current through the transparent electrode and the metal electrode, light is emitted from the light-emitting layer. The light emitted from the light-emitting layer is passed through the transparent electrode and the transparent substrate, and is emitted from the transparent substrate side toward the exterior of the EL element.

SUMMARY OF THE INVENTION

The related art EL display has been required to have a well-lighted display. This requirement can be met by increasing the light emission efficiency of the aforementioned EL element provided in the EL display.

The present invention addresses the aforementioned circumstances. Accordingly, it is an object of the present invention to provide an EL element capable of efficiently emitting the light emitted from a light-emitting layer toward the exterior of the device, and capable of realizing a well-lighted display. It is also an object of the invention to provide an EL display and an electronic apparatus provided with the aforementioned EL element.

In order to address the aforementioned problems, an EL element according to the present invention is provided with at least one organic layer including a light-emitting layer and a pair of electrodes opposed to each other with the aforementioned organic layer therebetween. One electrode of the aforementioned pair of electrodes is a transparent electrode, through which light emitted from the aforementioned light-emitting layer passes. A wavelength at the peak of the light emission of the aforementioned light-emitting layer and a wavelength at the peak of transmittance of the aforementioned transparent electrode are close to each other.

Furthermore, an EL element according to the present invention is provided with at least one organic layer including a light-emitting layer and a pair of electrodes opposed to each other with the aforementioned organic layer therebetween. The aforementioned light-emitting layer is the one which emits blue light. One electrode of the aforementioned pair of electrodes is a transparent electrode, through which light emitted from the aforementioned light-emitting layer passes. The aforementioned transparent electrode is made of an indium tin oxide film, and has a film thickness of 120±20 nm.

In the aforementioned EL element, when the aforementioned light-emitting layer is the one which emits green light, the film thickness of the aforementioned transparent electrode is 150±20 nm.

In the aforementioned EL element, when the aforementioned light-emitting layer is the one which emits red light, the film thickness of the aforementioned transparent electrode is 180±20 nm.

In order to address the aforementioned problems, an EL element according to the present invention is provided with at least one organic layer including a light-emitting layer and a pair of electrodes opposed to each other with the aforementioned organic layer therebetween. The aforementioned light-emitting layer is the one which emits blue light. One electrode of the aforementioned pair of electrodes is a transparent electrode, through which light emitted from the aforementioned light-emitting layer passes. The aforementioned transparent electrode is made of an indium zinc oxide film, and has a film thickness of 110±10 nm.

In the aforementioned EL element, when the aforementioned light-emitting layer is the one which emits green light, the film thickness of the aforementioned transparent electrode is 130±10 nm.

Furthermore, in the aforementioned EL element, when the aforementioned light-emitting layer is the one which emits red light, the film thickness of the aforementioned transparent electrode is 150±10 nm.

The inventors of the present application noted that the spectral characteristics of the transparent electrode varied depending on the film thickness, and as shown in examples described below, conducted research regarding the relationship between the film thickness of the transparent electrode and the color emitted from the light-emitting layer. As a result, it was discovered that, regarding the EL element, by specifying the film thickness of the transparent electrode to be within the range suitable for the color emitted from the light-emitting layer, a transparent electrode could be achieved that is capable of transmitting the light of the color emitted from the light-emitting layer with a high transmittance.

Furthermore, the inventors of the present application conducted research earnestly, and discovered that the range of the film thickness of the transparent electrode that is suitable for the color emitted from the light-emitting layer varied depending on the material constituting the transparent electrode. The inventors of the present application discovered that when the film thickness of the transparent electrode was specified to be within the suitable range in response to the color emitted from the light-emitting layer and the material for the transparent electrode in order that the transparent electrode was made to be capable of transmitting the light of the color emitted from the light-emitting layer with a high transmittance, a superior EL element could be produced that is capable of efficiently emitting the light emitted from a light-emitting layer toward the exterior and of realizing a well-lighted display.

The EL element according to the present invention includes the transparent electrode that is capable of transmitting the light of the color emitted from the light-emitting layer with a high transmittance because the film thickness of the transparent electrode is specified to be within the aforementioned range in response to the color emitted from the light-emitting layer and the material for the transparent electrode. Consequently, the spectral characteristics of the transparent electrode become suitable for the color emitted from the light-emitting layer. Therefore, a superior EL element is achieved that is capable of efficiently emitting the light emitted from a light-emitting layer toward the outside and of realizing well-lighted display.

In order to address the aforementioned problems, an EL display according to the present invention includes a plurality of EL elements arranged in a matrix and partition walls provided around the aforementioned EL elements on a substrate in order that each of the aforementioned EL elements can be energized individually. The EL element is any one of the aforementioned EL elements.

By making the EL display have the aforementioned configuration, an EL display can be provided that is capable of efficiently emitting the light emitted from the EL element toward the outside and of realizing well-lighted display.

In the aforementioned EL display, a red-emitting EL element, green-emitting EL element, and blue-emitting EL element may be used as the aforementioned EL elements.

By making the EL display have the aforementioned configuration, a full-color EL display can be provided that is capable of efficiently emitting the light emitted from the EL elements toward the outside and of realizing a well-lighted display.

The aforementioned EL display may be a color EL display in which the EL element according to a fourth aspect is used as the aforementioned red-emitting EL element, the EL element according to a third aspect is used as the aforementioned green-emitting EL element, and the EL element according to a second aspect is used as the aforementioned blue-emitting EL element.

The aforementioned EL display may be a color EL display in which the EL element according to a seventh aspect is used as the aforementioned red-emitting EL element, the EL element according to a sixth aspect is used as the aforementioned green-emitting EL element, and the EL element according to a fifth aspect is used as the aforementioned blue-emitting EL element.

Furthermore, in the aforementioned EL display, not all of the red-emitting EL element, green-emitting EL element, and blue-emitting EL element may include transparent electrodes made of the same material, and a transparent electrode made of indium tin oxide and a transparent electrode made of indium zinc oxide may be used concurrently. Consequently, a color EL display, in which the EL element according to the fourth or seventh aspects is used as the aforementioned red-emitting EL element, the EL element according to the third or sixth aspects is used as the aforementioned green-emitting EL element, and the EL element according to the second or fifth aspects is used as the aforementioned blue-emitting EL element, can be produced.

In an EL display having at least two emission colors including at least green emission and provided with at least one organic layer including a light-emitting layer and a pair of electrodes opposed to each other with the organic layer therebetween, one electrode of the aforementioned pair of electrodes is a transparent electrode through which light emitted from the aforementioned light-emitting layer passes, the aforementioned transparent electrode has the film thickness according to the third or sixth aspects, and the film thicknesses with respect to respective emission colors are in close agreement with each other.

Since the display based on the green emission has the highest luminous efficacy, an effectively well-lighted display can be realized by efficiently emitting the light emitted from the green-emitting EL element toward the exterior.

In addition, an electronic apparatus according to the present invention is provided with the aforementioned EL element.

By making the electronic apparatus have the aforementioned configuration, the electronic apparatus provided with a display portion having superior display quality can be achieved.

BRIEF DESCRIPTION OF THE DRAWINGS

FIG. 1 is a plan view of an EL display according to an embodiment of the present invention as viewed from the substrate side;

FIG. 2 is a schematic sectional view of a part of the EL display taken along plane A-A' shown in FIG. 1;

FIG. 3 is a schematic sectional view of an EL element according to an embodiment of the present invention showing the EL element provided in the EL display shown in FIG. 1;

FIG. 4 is a graph showing the relationship between the wavelength and the transmittance of an ITO film;

FIG. 5 is a graph showing the relationship between the wavelength and the transmittance of an IZO film;

FIG. 6 is a graph showing the relationship between the wavelength and the emission intensity of a green emission;

FIG. 7(a) is a perspective view of an example of a cellular phone provided with the EL display according to the aforementioned embodiment; FIG. 7(b) is a perspective view of an example of portable information processing equipment provided with the EL display according to the aforementioned embodiment; and FIG. 7(c) is a perspective view of an example of a wristwatch type electronic apparatus provided with the EL display according to the aforementioned embodiment.

DETAILED DESCRIPTION OF PREFERRED EMBODIMENTS

The present invention will be described below in detail with reference to the drawings.

FIG. 1 is a plan view of an EL display according to an embodiment of the present invention as viewed from the substrate side. FIG. 2 is a schematic sectional view of a part of the EL display taken along plane A-A' shown in FIG. 1. FIG. 3 is a schematic sectional view of an EL element according to an embodiment of the present invention showing the EL element provided in the EL display shown in FIG. 1.

FIG. 1 and FIG. 2 show a transparent substrate 1 made of glass, etc. A plurality of EL elements 10, each of which emits one of a red, green, and blue colors, are arranged in a matrix on the transparent substrate 1 in order to be individually energized by a metal electrode 5 and a transparent electrode 2 provided in grid-like array while intersecting. Partition walls 8 made of resin black resist, etc., that separate adjacent EL elements 10 are provided around each of the plurality of EL elements 10. In the EL display shown in FIG. 1 and FIG. 2, an EL element 11 includes a light-emitting layer 4R which emits red light, an EL element 12 includes a light-emitting layer 4G which emits green light, and an EL element 13 includes a light-emitting layer 4B which emits blue light.

In the green-emitting EL element 12, as shown in FIG. 3, a transparent electrode 2G made of an ITO film, a hole transportation layer 3 for helping hole injection from the transparent electrode 2G, a light-emitting layer 4G made of an EL material, and a metal electrode 5 are laminated in that order on the transparent substrate 1, and the transparent electrode 2G and the metal electrode 5 are opposed to each other with the light-emitting layer 4G therebetween.

The EL element 12 shown in FIG. 3 has a configuration in which the transparent electrode 2G functions as an anode, and the metal electrode 5 functions as a cathode. Therefore, by the passage of a predetermined current through the transparent electrode 2G and the metal electrode 5, the light-emitting layer 4G is made to emit green light. Subsequently, the green light emitted from the light-emitting layer 4G passes through the transparent electrode 2G and the transparent substrate 1, and is emitted from the transparent substrate 1 side (the bottom side in FIG. 3) toward the outside of the EL display.

In the EL element 12 shown in FIG. 3, the film thickness of the transparent electrode 2G is specified to be 150±20 nm.

Examples of the hole transportation layer 3 include, for example, triphenylamine derivatives, e.g., 4,4'-bis(m-triphenylamino)biphenyl (TPD), 4,4'-bis[N-(1-naphthyl)-N-phenylamino]biphenyl (α-NPD), 4,4',4"-tris[N-(3-methylphenyl)-N-phenylamino]triphenylamine (m-MTDATA), and those which use materials used for the conventional hole transportation layers, e.g., polyvinylcarbazole and polyethylenedioxythiophene. At least one kind of material is used as the material for the hole transportation layer 3.

The light-emitting layer 4G can be made of an organic El material (electroluminescent material), which has been used for conventional light-emitting layers and emits green light. Preferably, it is made of an organic El material, for example, quinacridone and a derivative thereof. At least one kind of material is used as the material for the light-emitting layer 4G.

Examples of the metal electrode 5 include, for example, those which use materials, e.g., aluminum, silver, silver alloy, magnesium, used for conventional metal electrodes.

In the red-emitting EL element 11 and the blue-emitting EL element 13, the thicknesses of the transparent electrodes 2 and materials used for the light-emitting layers 4 are different from those in the green-emitting EL element 12 shown in FIG. 3.

In the red-emitting EL element 11, the film thickness of the transparent electrode 2R is specified to be 180±20 nm.

The light-emitting layer 4R can be made of an organic El material, which has been used for conventional light-emitting layer and emits red light. Preferably, it is made of an organic El material, for example, rhodamine and a derivative thereof. At least one kind of material is used as the material for the light-emitting layer 4R.

In the blue-emitting EL element 13, the film thickness of the transparent electrode 2B is specified to be 120±20 nm.

The light-emitting layer 4B can be made of an organic El material, which has been used for conventional light-emitting layer and emits blue light. Preferably, it is made of an organic El material, for example, distyrylbiphenyl and a derivative thereof, coumarin and a derivative thereof, and tetraphenylbutadiene and a derivative thereof. At least one kind of material is used as the material for the light-emitting layer 4B.

Since the aforementioned EL display is provided with the green-emitting EL element 12, which includes the transparent electrode 2G having a film thickness of 150±20 nm, the red-emitting EL element 11, which includes the transparent electrode 2R having a film thickness of 180±20 nm, and the blue-emitting EL element 13, which includes the transparent electrode 2B having a film thickness of 120±20 nm, well-lighted display can be realized.

That is, the EL element 10 provided in the aforementioned EL display includes the transparent electrode 2 capable of transmitting the light of the color emitted from the light-emitting layer 4 with a high transmittance because the spectral characteristics of the transparent electrode 2 are made to be suitable for the color emitted from the light-emitting layer 4. Therefore, the light emitted from the light-emitting layer 4 can be efficiently emitted toward the exterior, and a well-lighted display can be realized.

Since the aforementioned EL display is provided with the red-emitting EL element 11, the green-emitting EL element 12, and the blue-emitting EL element 13, a color EL display that is capable of efficiently emitting the light emitted from the EL element 10 toward the exterior, and of achieving a well-lighted display can be produced.

In the EL display according to the present embodiment, the film thickness of the transparent electrode 2R of the red-emitting EL element 11, the film thickness of the transparent electrode 2G of the green-emitting EL element 12, and the film thickness of the transparent electrode 2B of the blue-emitting EL element 13 are made to be different from each other. However, as long as any one of the red-emitting EL element 11, the green-emitting EL element 12, and the blue-emitting EL element 13 is provided with the transparent electrode 2 having a film thickness within the aforementioned range, any two EL elements among the red-emitting EL element 11, the green-emitting EL element 12, and the blue-emitting EL element 13 may include the transparent electrodes 2 having the same film thickness, or every transparent electrode 2 may have the same film thickness. Regarding such an EL display, the manufacturing steps can be simplified compared to those for the EL display including transparent electrodes 2, each having a different film thickness, and the manufacture can be performed with ease.

When the film thickness of the transparent electrode 2 of any one of the red-emitting EL element 11, the green-emitting EL element 12, and the blue-emitting EL element 13 is made to be outside of the aforementioned range, it is desirable to give a higher priority to make the film thickness of the transparent electrode 2G of the green-emitting EL element 12 within the aforementioned range of the film thickness. Since the display based on the green emission has high luminous efficacy, effectively well-lighted display can be realized by efficiently emitting the light emitted from the green-emitting EL element 12 toward the exterior.

In the EL display according to the present embodiment, the transparent electrode 2 is made of ITO, although it may be made of an indium zinc oxide (hereafter abbreviated as IZO) film.

Furthermore, not all of the red-emitting EL element 11, the green-emitting EL element 12, and the blue-emitting EL element 13 may include transparent electrodes 2 made of the same material, and the transparent electrode made of ITO and the transparent electrode made of IZO may be used concurrently.

In the case where the transparent electrode 2 is made of the IZO film, when the film thickness of the transparent electrode 2G of the green-emitting EL element 12 is made to be 130±20 nm, the film thickness of the transparent electrode 2R of the red-emitting EL element 11 is made to be 150±20 nm, and the film thickness of the transparent electrode 2B of the blue-emitting EL element 13 is made to be 110±20 nm, the transparent electrode 2 that is capable of transmitting the light of the color emitted from the light-emitting layer 4 with a high transmittance is included because the spectral characteristics of the transparent electrode 2 are made to be suitable for the color emitted from the light-emitting layer 4. Therefore, effects similar to those in the aforementioned embodiment can be achieved, that is, the light emitted from the light-emitting layer 4 can be efficiently emitted toward the exterior, and a well-lighted display can be realized.

Although, in the present embodiment, as an example of the EL element according to the present invention, one formed of the transparent electrode 2, hole transportation layer 3, light-emitting layer 4G, and metal electrode 5, as shown in FIG. 3, has been described, the EL element according to the present invention is not limited to this example.

[Electronic Apparatus]

Next, specific examples of the electronic apparatuses provided with the EL display according to the aforementioned embodiment will be described.

FIG. 7(a) is a perspective view of an example of a cellular phone. In FIG. 7(a), reference numeral 500 denotes a main body of the cellular phone, and reference numeral 501 denotes an EL display portion provided with the aforementioned EL display 10.

FIG. 7(b) is a perspective view of an example of portable information processing equipment, for example, a word processor and personal computer. In FIG. 7(b), reference numeral 600 denotes information processing equipment, reference numeral 601 denotes an input portion, for example, a keyboard, reference numeral 603 denotes a main body for information processing, reference numeral 602 denotes an EL display portion provided with the aforementioned EL display 10.

FIG. 7(c) is a perspective view of an example of a wristwatch type electronic apparatus. In FIG. 7(c), reference numeral 700 denotes a main body of the watch and reference numeral 701 denotes an EL display portion provided with the aforementioned EL display 10.

The electronic apparatuses shown in FIGS. 7(a) to 7(c) are provided with the EL displays according to the aforementioned embodiment and, therefore, the electronic apparatuses provided with display portions having superior display quality can be achieved.

EXAMPLES

The present invention will be described below in detail using the examples.

Examination Example 1

ITO ($In_2O_3$—$SnO_2$=90/10 wt %) films having film thicknesses of 120 nm, 150 nm, and 180 nm were prepared. Regarding each of those ITO films, the relationship between the wavelength and the transmittance was measured, and the relationship between the film thickness of the ITO film and the spectral characteristics was examined. The results thereof are shown in FIG. 4.

FIG. 4 is a graph showing the relationship between the wavelength and the transmittance of the ITO film. In FIG. 4, a solid line indicates the result of the ITO film having a film thickness of 120 nm, a broken line indicates the result of the ITO film having a film thickness of 150 nm, and alternate long and short dashed lines indicate the result of the ITO film having a film thickness of 180 nm.

As is clear from FIG. 4, the ITO film having a film thickness of 120 nm has a peak of the transmittance in a blue color region, the ITO film having a film thickness of 150 nm has a peak of the transmittance in a green color region, and the ITO film having a film thickness of 180 nm has a peak of the transmittance in a red color region.

Examination Example 2

IZO ($In_2O_3$—$ZnO_2$=90/10 wt %) films having film thicknesses of 110 nm, 130 nm, and 150 nm were prepared. Regarding each of those IZO films, the relationship between the wavelength and the transmittance was measured, and the relationship between the film thickness of the IZO film and the spectral characteristics was examined. The results thereof are shown in FIG. 5.

FIG. 5 is a graph showing the relationship between the wavelength and the transmittance of the IZO film. In FIG. 5, a solid line indicates the result of the IZO film having a film thickness of 110 nm, a broken line indicates the result of the IZO film having a film thickness of 130 nm, and alternate long and short dashed lines indicate the result of the IZO film having a film thickness of 150 nm.

As is clear from FIG. 5, the IZO film having a film thickness of 110 nm has a peak of the transmittance in a blue color region, the IZO film having a film thickness of 130 nm has a peak of the transmittance in a green color region, and the IZO film having a film thickness of 150 nm has a peak of the transmittance in a red color region.

Examination Example 3

A green-emitting light-emitting layer was formed. The resulting light-emitting layer was made to emit green light, and the relationship between the wavelength and the emission intensity of the green emission emitted from the light-emitting layer was measured, and thereafter, the spectral characteristics of the green emission emitted from the light-emitting layer was examined. The results thereof are shown in FIG. 6.

FIG. 6 is a graph showing the relationship between the wavelength and the emission intensity of the green emission.

As is clear from FIG. 6, the wavelength, at which a peak of the emission intensity of the green emission emitted from the light-emitting layer appears, is about 550 nm.

As is clear from Examination example 1 and Examination example 3, when the film thickness of the ITO film is 150 nm, the peak of the transmittance appears in the neighborhood of the wavelength at which the peak of the emission intensity of the green emission appears, as shown in FIG. 4, and, therefore, the green emission emitted from the light-emitting layer can be transmitted with a high transmittance by making the film thickness of the ITO film 150 nm.

Furthermore, as is clear from Examination example 2 and Examination example 3, when the film thickness of the IZO film is 130 nm, the peak of the transmittance appears in the neighborhood of the wavelength at which the peak of the emission intensity of the green emission appears, as shown in FIG. 5, and, therefore, the green emission emitted from the light-emitting layer can be transmitted with a high transmittance by making the film thickness of the IZO film 130 nm.

Examination Example 4

Each of organic EL displays provided with organic EL elements including transparent electrodes made of ITO films similar to the ITO films prepared in Examination example 1 and light-emitting layers similar to those in Examination example 3 was prepared. Regarding each of those, the brightness was measured, and the relationship between the film thickness of the transparent electrode made of the ITO film and the brightness was examined.

As a result, the brightness of the display including the transparent electrode having a film thickness of 120 nm was 88.4 $cd/m^2$, the brightness of the display including the transparent electrode having a film thickness of 150 nm was 93.9 $cd/m^2$, and the brightness of the display including the transparent electrode having a film thickness of 180 nm was 90.2 $cd/m^2$.

Consequently, it could be verified that, in the organic EL display provided with the green-emitting organic EL element, the light emitted from the organic EL element could be efficiently emitted toward the exterior, and a well-lighted display could be realized by making the film thickness of the transparent electrode made of the ITO film about 150 nm.

Examination Example 5

Each of organic EL displays similar to those in Examination example 3 including transparent electrodes made of IZO films similar to the IZO films prepared in Examination example 2 was prepared. Regarding each of those IZO films, the brightness was measured, and the relationship between the film thickness of the transparent electrode made of the IZO film and the brightness was examined.

As a result, the brightness of the display including the transparent electrode having a film thickness of 110 nm was 90.1 cd/m$^2$, the brightness of the display including the transparent electrode having a film thickness of 130 nm was 95.6 cd/m$^2$, and the brightness of the display including the transparent electrode having a film thickness of 150 nm was 90.4 cd/m$^2$.

Consequently, it could be verified that in the organic EL display provided with the green-emitting organic EL element, the light emitted from the organic EL element could be efficiently emitted toward the exterior, and well-lighted display could be realized by making the film thickness of the transparent electrode made of the IZO film about 130 nm.

[Advantages]

As described above, regarding the EL element according to the present invention, in the case where the transparent electrode is made of the ITO film, when the EL element emits green light, the film thickness of the transparent electrode is specified to be 150±20 nm, when the EL element emits red light, the film thickness of the transparent electrode is specified to be 180±20 nm, and when the EL element emits blue light, the film thickness of the transparent electrode is specified to be 120±20 nm, and in the case where the transparent electrode is made of the IZO film, when the EL element emits green light, the film thickness of the transparent electrode is specified to be 130±10 nm, when the EL element emits red light, the film thickness of the transparent electrode is specified to be 150±10 nm, and when the EL element emits blue light, the film thickness of the transparent electrode is specified to be 110±10 nm. Consequently, the spectral characteristics of the transparent electrode are made to be suitable for the color emitted from the light-emitting layer, and the transparent electrode capable of transmitting the light of the color emitted from the light-emitting layer with a high transmittance can be included. Therefore, a superior EL element can be achieved that is capable of efficiently emitting the light emitted from the light-emitting layer toward the exterior, and of realizing well-lighted display.

Since the aforementioned light-emitting layer becomes a light-emitting layer having superior emission intensity by including an organic EL material, an EL element can be achieved that is capable of realizing further well-lighted display.

Since the EL display according to the present invention is provided with the EL element according to the present invention, the light emitted from the EL element can be efficiently emitted toward the exterior, and a well-lighted display can be realized.

Furthermore, by using the red-emitting EL element, green-emitting EL element, and blue-emitting EL element as the EL elements, a color EL display can be provided that is capable of efficiently emitting the light emitted from the EL element toward the exterior, and of realizing well-lighted display.

Since the electronic apparatus according to the present invention is provided with the aforementioned EL element, the electronic apparatus can be achieved that is provided with a display portion having a superior display quality.

What is claimed is:

1. An EL element, comprising:

at least one organic layer that includes a light-emitting layer, and a pair of electrodes opposed to each other, the at least one organic layer being disposed between the pair of electrodes, one electrode of the pair of electrodes being a transparent electrode, through which light emitted from the light-emitting layer passes, a wavelength at a peak of light emission of the light-emitting layer corresponding to wavelength at a peak of transmittance of the transparent electrode.

2. An EL display, comprising:

a plurality of EL elements arranged in a matrix;

a substrate; and partition walls provided around the EL elements on the substrate such that each EL element of the EL elements can be energized individually, at least one EL element of the EL elements being the EL element according to claim 1.

3. The EL display according to claim 2, the EL elements include a red-emitting EL element, a green-emitting EL element, and a blue-emitting EL element.

4. The EL display according to claim 3, the red-emitting EL element including at least one organic layer that includes a red light-emitting layer, the red light-emitting layer emitting a spectrum of light and peaking in a red region of the spectrum;

the green-emitting EL element including at least one organic layer that includes a green light-emitting layer, the green light-emitting layer emitting a spectrum of light and peaking in a green region of the spectrum; and the blue-emitting EL element including at least one organic layer that includes a blue light-emitting layer, the blue light-emitting layer emitting a spectrum of light and peaking in a blue region of the spectrum; and each of the red-emitting EL element, green-emitting EL element, and blue-emitting EL element further comprising a pair of electrodes opposed to each other, the at least one organic layer being disposed between the pair of electrodes, one electrode of the pair of electrodes being a transparent electrode, through which light emitted from the red, green or blue light-emitting layer passes, and the transparent electrode including an indium tin oxide film, and having a film thickness chosen so that a peak in the transmittance of the transparent electrode corresponds to a peak in the emission spectrum of the red, green, or blue light emitting layer.

5. The EL display according to claim 3, the red-emitting EL element including at least one organic layer that includes a red light-emitting layer, the red light-emitting layer emitting a spectrum of light and peaking in a red region of the spectrum; and the green-emitting EL element including at least one organic layer that includes a green light-emitting layer, the green light-emitting layer emitting a spectrum of light and peaking in a green region of the spectrum;

the blue-emitting EL element including at least one organic layer that includes a blue light-emitting layer, the blue light-emitting layer emitting a spectrum of light and peaking in a blue region of the spectrum; and each of the red-emitting EL element, green-emitting EL element, and blue-emitting EL element further comprising a pair of electrodes opposed to each other, the at least one organic layer being disposed between the pair of electrodes, one electrode of the pair of electrodes being a transparent electrode, through which light emitted from the red, green or blue light-emitting layer passes, and the transparent electrode including an indium zinc oxide film, and having a film thickness chosen so that a peak in the transmittance of the transparent electrode corresponds to a peak in the emission spectrum of the red, green or blue light-emitting layer.

6. An electronic apparatus, comprising:
the EL element according to claim 1.

7. An EL element, comprising:
at least one organic layer that includes a light-emitting layer, the light-emitting layer emitting a spectrum of light and peaking in a blue region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium tin oxide film, and having a film thickness chosen so that a peak in the transmittance of the transparent electrode corresponds to a peak in the emission spectrum of the light-emitting layer.

8. The EL element of claim 7, wherein the thickness of the transparent electrode is about 120±20 nm.

9. An EL element, comprising:
at least one organic layer that includes a light-emitting layer, the light-emitting layer emitting a spectrum of light and peaking in a green region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium tin oxide film, and having a film thickness chosen so that a peak in the transmittance of the transparent electrode corresponds to a peak in the emission spectrum of the light-emitting layer.

10. The EL element of claim 9, wherein the thickness of the transparent electrode is about 150±20 nm.

11. An EL element, comprising:
at least one organic layer that includes a light-emitting layer, the light-emitting layer emitting a spectrum of light and peaking in a red region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium tin oxide film, and having a film thickness chosen so that a peak in the transmittance of the transparent electrode corresponds to a peak in the emission spectrum of the light-emitting layer.

12. The EL element of claim 11, wherein the thickness of the transparent electrode is about 180±20 nm.

13. An EL element, comprising:
at least one organic layer that includes a light-emitting layer, the light-emitting layer emitting a spectrum of light and peaking in a blue region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium zinc oxide film, and having a film thickness chosen so that a peak in the transmittance of the transparent electrode corresponds to a peak in the emission spectrum of the light-emitting layer.

14. The EL element of claim 13, wherein the thickness of the transparent electrode is about 110±10 nm.

15. An EL element, comprising:
at least one organic layer that includes a light-emitting layer, the light-emitting layer emitting as spectrum of light and peaking in a green region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium zinc oxide film, and having a film thickness chosen so that a peak in the transmittance of the transparent electrode corresponds to a peak in the emission spectrum of the light-emitting layer.

16. The EL element of claim 15, wherein the thickness of the transparent electrode is about 130±10 nm.

17. An EL element, comprising:
at least one organic layer that includes a light-emitting layer, the light-emitting layer emitting a spectrum of light and peaking in a red region of the spectrum; and
a pair of electrodes opposed to each other, the at least one organic layer being disposed between the pair of electrodes, one electrode of the pair of electrodes being a transparent electrode, through which light emitted from the light-emitting layer passes, and the transparent electrode including an indium zinc oxide film, and having a film thickness chosen so that a peak in the transmittance of the transparent electrode corresponds to a peak in the emission spectrum of the light-emitting layer.

18. The EL element of claim 17, wherein the thickness of the transparent electrode is about 150±10 nm.

19. An EL display having at least two emission colors including at least green emission, comprising:
at least one organic layer that includes a light-emitting layer emitting a spectrum of light; and
a pair of electrodes opposed to each other, the at least one organic layer being disposed between the pair of electrodes, one electrode of the pair of electrodes being a transparent electrode, through which light emitted from the light-emitting layer passes, the transparent electrode having a film thickness chosen so that a peak in the transmittance of the transparent electrode corresponds to a peak in the emission spectrum of the light-emitting layer.

20. An electronic apparatus, comprising:
the EL display according to claim 19.

* * * * *